(12) United States Patent
Motakef et al.

(10) Patent No.: US 7,019,266 B1
(45) Date of Patent: **\*Mar. 28, 2006**

(54) SUBSTANTIALLY-UNIFORM-TEMPERATURE ANNEALING

(75) Inventors: Shariar Motakef, Weston, MA (US); Serhat Yesilyurt, Cambridge, MA (US)

(73) Assignee: Cape Simulations, Inc., Natick, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/947,912

(22) Filed: Sep. 23, 2004

Related U.S. Application Data

(60) Continuation-in-part of application No. 10/623,877, filed on Jul. 21, 2003, now Pat. No. 6,919,539, which is a division of application No. 09/910,287, filed on Jul. 20, 2001, now Pat. No. 6,624,390.

(51) Int. Cl.
*F27B 5/08* (2006.01)
*F27B 5/14* (2006.01)
*F27B 3/28* (2006.01)
*F27D 1/10* (2006.01)

(52) U.S. Cl. ............... 219/413; 219/390; 219/399; 117/3; 117/204

(58) Field of Classification Search ................ 219/390, 219/394, 399, 407, 413; 117/202, 204, 206; 373/109, 110, 119, 136, 137
See application file for complete search history.

(56) References Cited

U.S. PATENT DOCUMENTS

| | | | | |
|---|---|---|---|---|
| 6,146,456 A | * | 11/2000 | Mizugaki et al. | 117/2 |
| 6,309,461 B1 | * | 10/2001 | Gianoulakis et al. | 117/206 |
| 6,350,310 B1 | * | 2/2002 | Gianoulakis | 117/2 |
| 6,773,503 B1 | * | 8/2004 | Chiba | 117/3 |
| 6,811,606 B1 | * | 11/2004 | Sakuma et al. | 117/3 |

\* cited by examiner

*Primary Examiner*—Joseph Pelham
(74) *Attorney, Agent, or Firm*—Shane H. Hunter; Mintz, Levin, Cohn, Ferris, Glovsky & Popeo, P.C.

(57) ABSTRACT

A method of heating an optical member includes providing the optical member, directing heat from a heat source toward the optical member, and distributing the heat about the optical member through a high-thermal-conductivity apparatus disposed between the heat source and the optical member such that a surface of the apparatus defining a volume for receiving the optical member will have a substantially uniform temperature.

17 Claims, 4 Drawing Sheets

SUBSTANTIALLY-UNIFORM-TEMPERATURE ANNEALING

CROSS-REFERENCE TO RELATED ACTIONS

This application claims the benefit of U.S. application Ser. No. 10/623,877 filed Jul. 21, 2003, and U.S. application Ser. No. 09/910,287, now U.S. Pat. No. 6,624,390, filed Jul. 20, 2001, the contents of both of which are incorporated here by reference. This application is a continuation-in-part of U.S. application Ser. No. 10/623,877 filed Jul. 21, 2003, now U.S. Pat. No. 6,919,539, which is a division of U.S. application Ser. No. 09/910,287 filed Jul. 20, 2001, now U.S. Pat. No. 6,624,390.

FIELD OF THE INVENTION

The invention relates to annealing and more particularly to annealing of single crystals to yield single crystals with low stress birefringence such as for use as optical lenses.

BACKGROUND OF THE INVENTION

The increase in the processing speed, functionality, and integration in integrated circuits (ICs) has been achieved through continuous reduction in the feature sizes of the ICs. A portion of the manufacturing of the ICs affecting attainable feature sizes is photolithography. During photolithography, a pattern of the IC is transferred from a mask to a wafer, e.g., a semiconducting wafer. Imaging characteristics of modern projection optical photolithography equipment are dominated by diffraction effects. The resolution (i.e. the smallest feature size that can be printed on the wafer) is $k_1 \lambda/NA$, where $\lambda$ is the wavelength of the light source, $k_1$ is a constant approximately equal to 0.5, and NA is the numerical aperture of the projection optics. The depth of focus of the projection printer over which the image quality is not degraded is limited and is equal to $k_2 \lambda/(NA)^2$, where $k_2$ is a constant that depends on $k_1$. Thus, to decrease the feature size either the wavelength of exposure must be reduced or the NA of the optics must be increased.

Increasing the optics NA to reduce feature size results in a substantial reduction in the depth of focus ($\sim(NA)^{-2}$), which is undesirable, particularly because the depth of focus must be larger than any variations in the flatness of the photoresist surface. Therefore, the semiconductor industry is pursuing the use of short wavelength exposure sources for achieving smaller and smaller feature sizes. KrF, ArF, and $F_2$ excimer lasers are presently available as light sources for, respectively, 248, 193, and 157 nm photolithography. The synthetic fused silica, however, that has been the optical material of choice for higher wavelength exposure sources, exhibits significant loss of transmittance at wavelengths below 200 nm.

Single crystals of Calcium Fluoride ($CaF_2$) exhibit the desirable optical properties for sub 200-nm-photolithography. Furthermore, for historical reasons the production knowledgebase for $CaF_2$ is relatively extensive. Other single crystals of fluoride such as $BaF_2$ and LiF are also possible material candidates, but are significantly behind $CaF_2$ in production technology, and may be less desirable, e.g., due to toxicity and corrosiveness ($BaF_2$) and/or expense (LiF). Therefore, single crystal $CaF_2$ are desirable and suitable optical material for 193 and 157 nm optical steppers. Presently, $CaF_2$ crystals as large as 30 cm in diameter and 10 cm in height are used in photolithography equipment.

Single crystals of $CaF_2$ are grown by directional solidification from the melt phase. In this process layers of the melt are continuously solidified, by changing the temperature of the crystal, to form a single crystal boule. The crystal boule is subsequently cooled to room temperature. The transfer of heat from and through the crystal sets up temperature gradients (i.e. temperature non-uniformities) and associated thermal stresses in the single crystal. $CaF_2$ is a relatively weak material, especially at elevated temperatures, and therefore experiences plastic deformation under thermal stresses during the crystal growth process. The accumulation of plastic strain during the crystal growth process results in generation of residual stresses in the crystal at room temperature. Residual stresses, in turn, cause stress birefringence through spatial variations in the material's index of refraction, and an associated degradation of optical characteristics of components made from this material.

Annealing is used to reduce residual stresses in crystals that have experienced plastic deformation during the crystals' growth process. To anneal a crystal, the crystal is maintained at an elevated temperature close to its melting point temperature for a period of time. This constant temperature is intended to allow existing residual stresses to relax. The crystal is cooled to room temperature. During cooling, temperature gradients associated with the cooling of the crystal generate thermal stresses in the crystal that may cause the crystal to undergo plastic deformation.

Due to the nature of the material, temperature variations to which a single crystal is exposed to during growth and annealing result in large thermal stresses leading to plastic deformation of the crystal and, hence, large residual birefringence.

SUMMARY OF THE INVENTION

In general, in an aspect, the invention provides a system for heating optical members. The system includes a thermally-conductive inner housing defining an interior volume for receiving an optical member to be heated, a thermally-insulative outer housing at least partially containing the thermally-conductive inner housing, and a heating structure disposed outside the inner housing and configured to provide heat through the thermally-conductive inner housing and into the interior volume defined by the inner housing.

Implementations of the invention may include one or more of the following features. The inner housing is configured such that an inner surface defining the interior volume has a substantially uniform temperature in response to the inner housing receiving the heat provided by the heating structure. The inner housing is configured to define the interior volume to be axi-symmetric.

Further implementations of the invention may include one or more of the following features. The system further comprises a controller coupled to the heating structure and configured to control the heating structure such that the member disposed in the interior volume is heated substantially without being plastically deformed. The controller is configured to control the heating structure such that a resolved shear stress of a $CaF_2$ optical member disposed in the interior volume does not exceed about $0.5e^{(990/T)}$ MPa where T is average temperature of the member in Kelvin.

Further implementations of the invention may include one or more of the following features. A portion of the outer housing in contact with and supporting the inner housing has a thermal conductivity different than at least one other portion of the outer housing. An inner boundary of the outer housing is disposed in contact with substantially an entire outer boundary of the inner housing. The inner housing and at least a portion of the outer housing are an integral structure, with the inner housing and the at least a portion of the outer housing being layers of the integral structure with different thermal conductivity.

Further implementations of the invention may include one or more of the following features. The inner housing comprises at least one of high-thermal-conductivity graphite and high-thermal-conductivity carbon. The interior volume is cylindrical and directions of highest thermal conductivity of the inner housing are parallel with inner surfaces of the inner housing. The interior volume is cylindrical and directions of lowest thermal conductivity of the inner housing are perpendicular with inner surfaces of the inner housing. Directions of lowest thermal conductivity of the outer housing are perpendicular with outer surfaces of the inner housing.

Further implementations of the invention may include one or more of the following features. The inner housing has substantially orthotropic thermal conductivity. The outer housing comprises at least one of low-thermal-conductivity graphite, low-thermal-conductivity carbon, low-thermal-conductivity porous graphite, low-thermal-conductivity porous carbon, low-thermal-conductivity fibrous graphite, low-thermal-conductivity fibrous carbon. The outer housing has substantially orthotropic thermal conductivity. The system further comprises another thermally-conductive housing, the another thermally-conductive housing substantially contains the thermally-insulative outer housing. The another thermally-conductive housing is displaced from the outer housing.

Further implementations of the invention may include one or more of the following features. The inner housing defines a plurality of interior volumes each for receiving an optical member to be heated. The inner housing has a substantially isotropic thermal conductivity. The outer housing has a substantially isotropic thermal conductivity. At least a portion of the heating structure is disposed outside the outer housing.

In general, in another aspect, the invention provides a method of heating an optical member. The method includes providing the optical member, directing heat from a heat source toward the optical member, and distributing the heat about the optical member through a high-thermal-conductivity apparatus disposed between the heat source and the optical member such that a surface of the apparatus defining a volume for receiving the optical member will have a substantially uniform temperature.

Implementations of the invention may include one or more of the following features. The heat is distributed such that temperatures of the surface of the apparatus defining the volume vary by no more than about 0.5 K where K is temperature in Kelvin. The method further comprises measuring at least one indication of temperature of the apparatus defining the volume. The at least one indication includes a plurality of indicia of temperature of the apparatus, the indicia being related to at least one of an outer surface, an inner surface, and an interior of the apparatus. The method further comprises adjusting how much heat is directed toward the optical member in accordance with the at least one indication. The adjusting is in accordance with a model of temperature variations within the optical member. How much heat is directed toward the optical member is adjusted to guard against stress within the optical member exceeding a critical resolved shear stress of the optical member during at least one of annealing of the optical member and cool down of the optical member.

Further implementations of the invention may include one or more of the following features. The method further comprises inhibiting heat from transferring away from the optical member from the high-thermal-conductivity apparatus. A plurality of optical members is provided, wherein heat is directed from a heat source toward each of the optical members, and wherein the heat is distributed about each of the optical members through the high-thermal-conductivity apparatus disposed between the heat source and the optical members such that surfaces of the apparatus defining volumes for receiving the optical members will each have a substantially uniform temperature.

In general, in another aspect, the invention provides a system for annealing at least one single crystal blank for use as at least one optical lens. The system includes a heating structure for supplying heat, heating means for heating the at least one single crystal blank, using the heat from the heating structure, to an annealing temperature of the blank and for cooling the at least one single crystal blank from the annealing temperature to an ambient temperature substantially without plastic deformations developing in the at least one blank, the heating means including at least a high-thermal-conductivity housing for containing the at least one single crystal blank.

Implementations of the invention may include one or more of the following features. The heating means further includes an insulator structure at least partially containing the high-thermal-conductivity housing. The heating means further includes a controller coupled to the heating structure for regulating heat provided by the heating structure to permit annealing of the at least one blank while inhibiting temperature gradients inside the at least one blank from producing plastic deformations. The heating means further comprises temperature sensors coupled to the controller configured to provide indicia of temperatures of the high-thermal-conductivity housing to the controller and wherein the controller regulates the heat provided by the heating structure in response to the indicia provided by the temperature sensors. The controller inhibits temperature gradients inside each of the at least one blank from producing stresses in excess of about $0.5e^{(990/T)}$ MPa where T is average temperature of each blank in Kelvin.

In general, in another aspect, the invention provides an optical member including a single crystal material substantially free of residual stress and having an optical birefringence of less than about 1 nm/cm.

Implementations of the invention may include one or more of the following features. The single crystal material forms an optical lens blank. The single crystal material is a fluoride. The single crystal material is $CaF_2$.

In general, in another aspect, the invention provides a method of heating an optical member, the method including providing the optical member, directing heat from a heat source toward the optical member, and distributing the heat about the optical member through a high-thermal-conductivity apparatus disposed between the heat source and the optical member such that a surface of the apparatus defining a volume for receiving the optical member will have a substantially uniform temperature.

Implementations of the invention may include one or more of the following features. The heat is distributed such that temperatures of the surface of the apparatus defining the volume vary by no more than about 0.5 Kelvin. The method further includes measuring at least one indication of temperature of the apparatus defining the volume. The at least one indication includes a plurality of indicia of temperature of the apparatus, the indicia being related to at least one of an outer surface, an inner surface, and an interior of the apparatus. The method further includes adjusting how much heat is directed toward the optical member in accordance with the at least one indication. The adjusting is in accordance with a model of temperature variations within the optical member. How much heat is directed toward the optical member is adjusted to guard against stress within the optical member exceeding a critical resolved shear stress of the optical member during at least one of annealing of the optical member and cool down of the optical member. Optical members are provided, where heat is directed from a heat source toward each of the optical members, and where the heat is distributed about each of the optical members through the high-thermal-conductivity apparatus disposed between the heat source and the optical members such that surfaces of the apparatus defining volumes for receiving the optical members will each have a substantially uniform temperature.

In general, in another aspect, the invention provides a method of annealing at least one optical member, the method including providing the at least one optical member, and annealing the at least one optical member by heating the at least one optical member to an annealing temperature in a substantially isothermal environment and cooling the at least one optical member at a rate and in the substantially isothermal environment such that spatial temperature non-uniformities in the optical member stay below a level that would induce plastic deformation of the at least one optical member.

Implementations of the invention may include one or more of the following features. The optical member comprises calcium fluoride. The cooling is performed such that temperature gradients inside of the optical member are less than about $0.5e^{(990/T)}$ MPa where T is an average temperature in Kelvin of the optical member. The optical member is cylindrical and the annealing is performed such that an edge-to-center temperature difference is less than a critical temperature difference (CTD), the CTD varying with average optical member temperature $T_{avg}$, the CTD:

being about 0.5° C. for $T_{avg}$ above about 10001° C.;
varying approximately linearly from about 0.5° C. at a $T_{avg}$ of 1000° C. to about 0.7° C. at a $T_{avg}$ of 800° C.;
varying approximately linearly from about 0.7° C. at a $T_{avg}$ of 800° C. to about 1.2° C. at a $T_{avg}$ of 500° C.; and
varying approximately linearly from about 1.2° C. at a $T_{avg}$ of 500° C. to about 3.5° C. at a $T_{avg}$ of 200° C.

The cooling is performed at a cooling rate equal to:

$$\frac{k \cdot \Delta T \cdot \text{thermal diffusitivity} \cdot [a0 + a1 \cdot (L/D) + a2 \cdot (L/D)^2]}{(L/D) \cdot \text{surface area}}$$

where k, a0, a1, and a2 are constants, $\Delta T$ is the edge-to-center temperature difference, and L/D is a ratio of a height versus a diameter of the optical member. The constant a0 has a value of about 1.349, a1 has a value of about −2.146, and a2 has a value of about 1.948.

The constant k is approximately:
95 with $T_{avg}$ from about 1000° C. to about 900° C.,
93 with $T_{avg}$ from about 900° C. to about 700° C.,
94 with $T_{avg}$ from about 700° C. to about 600° C.,
98 with $T_{avg}$ from about 600° C. to about 500° C.,
107 with $T_{avg}$ from about 500° C. to about 400° C.,
128 with $T_{avg}$ from about 400° C. to about 300° C., and
193 with $T_{avg}$ from about 300° C. and lower.

The annealing includes monitoring at least one indication of temperature and providing heat to the optical member dependent upon the at least one indication.

In general, in another aspect, the invention provides a relaxed-stress optical member made by a method including providing a stressed optical member, and annealing the stressed optical member by heating the stressed optical member to an annealing temperature in a substantially isothermal environment to form an annealed optical member and cooling the annealed optical member at a rate and in the substantially isothermal environment such that spatial temperature non-uniformities in the annealed optical member stay below a level that would induce plastic deformation of the annealed optical member.

Various aspects of the invention may provide one or more of the following capabilities. A substantially isothermal environment may be provided for members, such as optical blanks or lenses, to be annealed (during annealing and cool down), or otherwise heat treated. Temperature nonuniformities along walls of a chamber containing a member to be heated can be reduced relative to prior systems. Heat loss through a support structure for supporting a chamber to contain a member to be heated can be reduced relative to prior systems. Time-dependent variations of temperature on an interior portion of a container of a member to be heated can be dampened relative to corresponding time-dependent variations on an exterior portion of the container. Radial temperature variations within an axi-symmetric crystal can be kept below a level that would induce stresses exceeding a critical resolved shear stress of the crystal during an annealing and/or cool down period. Annealed items, e.g., optical members, can be produced with low birefringence, e.g., less than about 1 nm/cm.

These and other capabilities of the invention, along with the invention itself, will be more fully understood after a review of the following figures, detailed description, and claims.

DETAILED DESCRIPTION OF PREFERRED EMBODIMENTS

Figure 1:
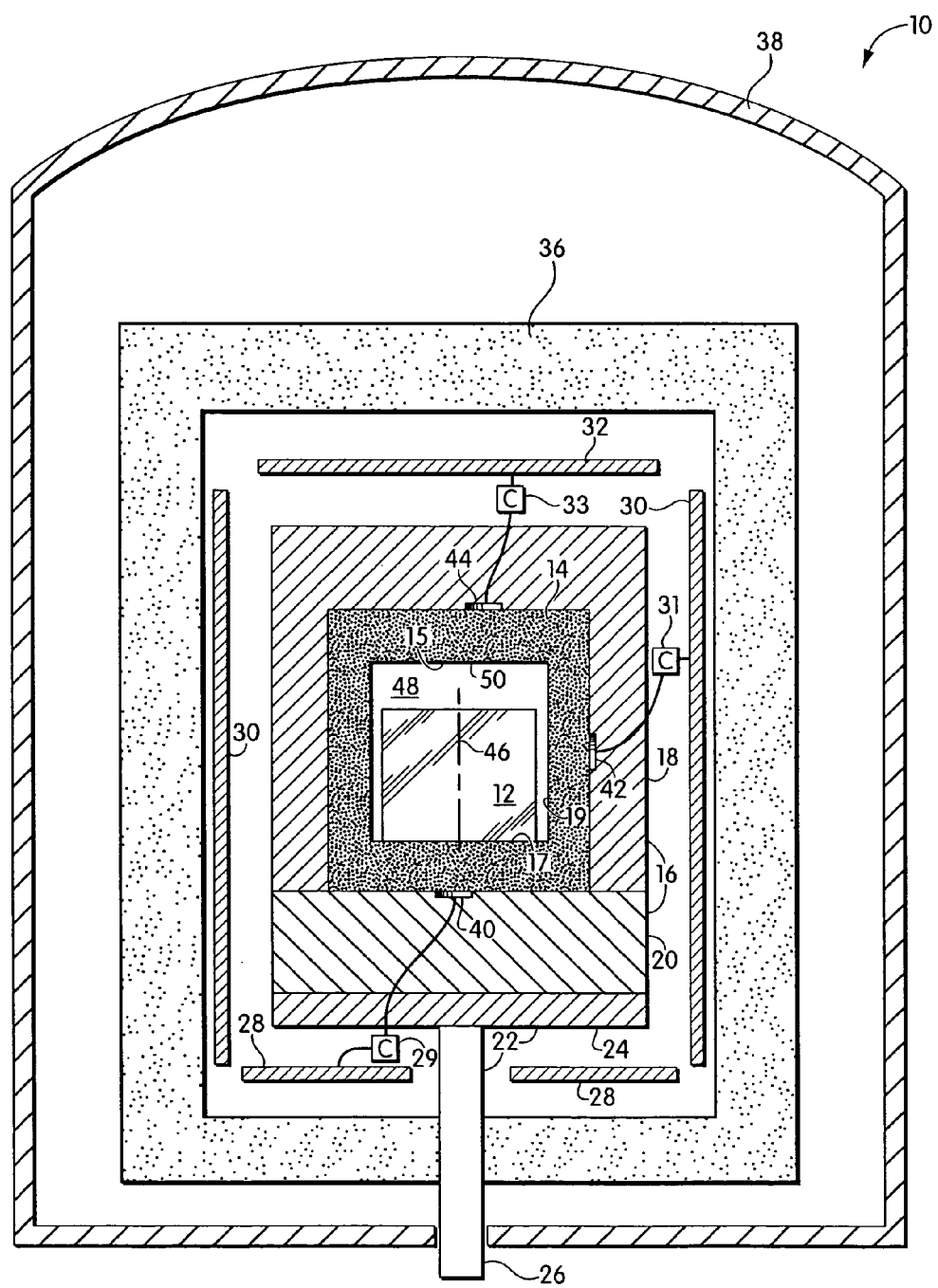
FIG. 1 is a schematic cross-sectional view (with a blank shown in cut-away) of an annealing system.

Referring to FIG. 1, an annealing system 10 includes a single crystal blank 12, an inner housing 14, an outer housing 16, including a cap 18 and a base 20, a support 22, including a platform 24 and shaft 26, a heating structure including heating elements 28, 30, 32, controllers 29, 31, 33, temperature sensors 40, 42, 44, an insulator 36, and a system housing 38. The system 10 is configured for high-temperature annealing of single crystals as described below. The system 10 can accurately maintain temperature in the crystal 12 at levels equal to and below levels needed to promote complete, or near complete, relaxation of stresses during a constant-temperature phase of an annealing process. The system 10 can also maintain spatial temperature non-uniformities in the crystal 12 at or below levels inducing plastic deformation of the crystal 12 and accumulation of plastic strain in the crystal 12 during a cool-down phase, to room temperature of the annealing process.

The blank 12 is any material to be annealed. For example, here the blank 12 is a single crystal of a material suitable for use as an optical component. One or more optical components may be made from the blank 12, e.g., by dividing such as by cutting the blank 12. For example, the blank 12 can be a single crystal fluoride material such as calcium fluoride $CaF_2$, although other materials may be used. The blank 12 can be axi-symmetric, for example being cylindrical about an axis 46. Blank 12 can be of various shapes and/or sizes, e.g., or cylinder, e.g., 30 cm in diameter and 10 cm in height.

The inner housing 14 is a high-thermal conductivity material configured to contain the blank 12. The inner housing 14 defines an interior volume 48 of a size able to receive the blank 12. A resealable entry (not shown) is provided in the housing 14 to be opened to receive the blank 12 and to be sealed during annealing of the blank 12. The housing 14 is made of a high-thermal conductivity material, such as high-purity graphite EK 94P, made by Ringsdorff-Werke GmbH of Bonn, Germany. This material, according to the manufacturer, has a thermal conductivity close to 0.7 W/cm-K at 1200 K. The housing 14 is configured such that its top and bottom walls 15, 17 have their highest (lowest) thermal conductivity directions parallel (perpendicular) to a radial direction from the axis 46. Also, the side/lateral wall 19 has its highest (lowest) thermal conductivity direction parallel (perpendicular) to the axis 46. Thus, the highest (lowest) thermal conductivity directions are parallel (perpendicular) to an interior surface 50 of the inner housing 14. Thickness(es) of the housing 14 is (are) such that heat provided by the heaters 28, 30, 32 to the housing 14 will be conducted and distributed throughout the housing 14 to provide a substantially uniform temperature on the interior surface 50 of the housing 14.

Adding to the ability of the system 10 to provide a substantially isothermal environment in the volume 48 is the outer housing 16. The housing 16 is insulative in nature, having a much lower thermal conductivity than the inner housing 14. The outer housing 16 provides a higher thermal resistance in directions away from the inner housing 14 (i.e., in directions normal to the exterior surfaces of the inner housing 14) than the thermal resistance along the exterior surfaces of the inner housing 14. The outer housing 16 and in particular cap 18, is of a low thermal conductivity material such as graphite fiber foam, made by Calcarb Limited of North Lanarkshire, Scotland. This material, according to Calcarb, has a thermal conductivity approximately equal to 0.005 W/cm-K at 1273 K. The base 20 may contain some materials of a slightly higher thermal conductivity to increase stiffness of the base to provide adequate support for the cap 18 and the inner housing 14, containing the blank 12. The cap 18 is shown in physical contact with the inner housing 14, although a gap, such as a vacuum or inert-gas-filled gap, may be provided between the cap 18 and the housing 14. The gas may include fluoride if a fluoride blank is used, or may include argon.

The support 22 is configured to support the outer housing 16, containing the inner housing 14, containing the blank 12, while providing thermal resistance. The support 22 is made of a hard material with the platform 24 being of hard and soft (low thermal conductivity) materials in a combination such that the support 22 provides thermal resistance and sufficient rigidity to support the components shown. The shaft 26 of the support 22 extends away from the outer housing 16 through the insulator 36 and the system housing 38.

The system housing 38 is a metallic housing defining an outer perimeter of the system 10. The housing 38 is configured to be sufficiently air-tight and to allow for evacuation of gases from within the housing 38 to produce pressures inside the housing 38 as low as one-tenth to one-hundredth of one atmosphere, as well as to allow introduction of process gases of pressures up to slightly over one atmosphere. The housing 38 is water cooled to maintain a desired temperature, dissipating, as necessary, heat received from the heaters 28, 30, 32 through the insulator 36. The outer housing 38 is supported by an external structure not shown in FIG. 1.

The insulator 36 is provided to help reduce heat loss from the system 10. In particular, the insulator 36 is made of an insulating material such as graphite to inhibit heat from the heaters 28, 30, 32 being transferred away from the blank 12.

The heaters 28, 30, 32 are configured to provide heat to heat the blank 12 to desired temperatures for annealing, or other desired processes. The heaters 28, 30, 32, e.g., resistive graphite heaters, may be configured to directionally supply heat toward the blank 12. Heat from the heaters 28, 30, 32 may transfer in directions away from the blank 12, and is inhibited from doing so by the insulator 36. The heaters 28, 30, 32 are configured to supply amounts of heat in response to control signals received from respective controllers 29, 31, 33.

The controllers 29, 31, 33 are configured to send signals to the heaters 28, 30, 32 to regulate the amount of heat provided by the heaters 28, 30, 32 in response to temperature indicia provided by the temperature sensors 40, 42, 44. The temperature sensors 40, 42, 44 monitor the temperature at various points on the inner housing 14 (e.g., on exterior surfaces as shown, or on interior surfaces, or inside the housing 14) and provide indicia of these temperatures through signals to the respective controllers 29, 31, 33. The controllers 29, 31,33 use the temperature indicia from the sensors 40, 42, 44, to provide the control signals to the heaters 28, 30, 32 in accordance with temperatures or temperature schedules, that depend on a particular process currently undergone by the blank 12. The temperature and temperature schedules for the blank 12 are determined in order to inhibit plastic deformations and residual stresses inducing stress birefiingence in the blank 12.

Non-uniform temperature fields lead to thermal stresses in the crystal 12, and excessive thermal stresses during growth and annealing cause plastic deformation of the crystal. The system 10 is configured to provide post-growth annealing that maintains a quantifiably controllable uniform temperature distribution in optical members, such as fluoride crystals, in particular $CaF_2$, both during the constant temperature period as well as cool-down period of the annealing process.

In general, single crystals such as $CaF_2$ experience plastic deformation along specific crystallographic planes and directions, the so-called slip planes and slip directions. For example, the slip system of $CaF_2$ is defined as $\{100\}<110>$, where $\{100\}$ refers to the orientation of the family of vectors normal to the slip planes and $<110>$ the family of direction vectors along which slip occurs.

The crystal 12 undergoes plastic deformation if the projection of thermal stresses onto the slip directions, the so-called resolved shear stresses, exceed the so-called Critical Resolved Shear Stress (CRSS) of the crystal. The CRSS is a property of the crystal 12. Stresses higher than the CRSS will result in plastic deformations and hence birefringence.

Stresses smaller than the CRSS will result in elastic deformation of the material and will not cause permanent deformations resulting from plastic deformation. Thus, stresses smaller than the CRSS will not cause birefringence.

Figure 2:
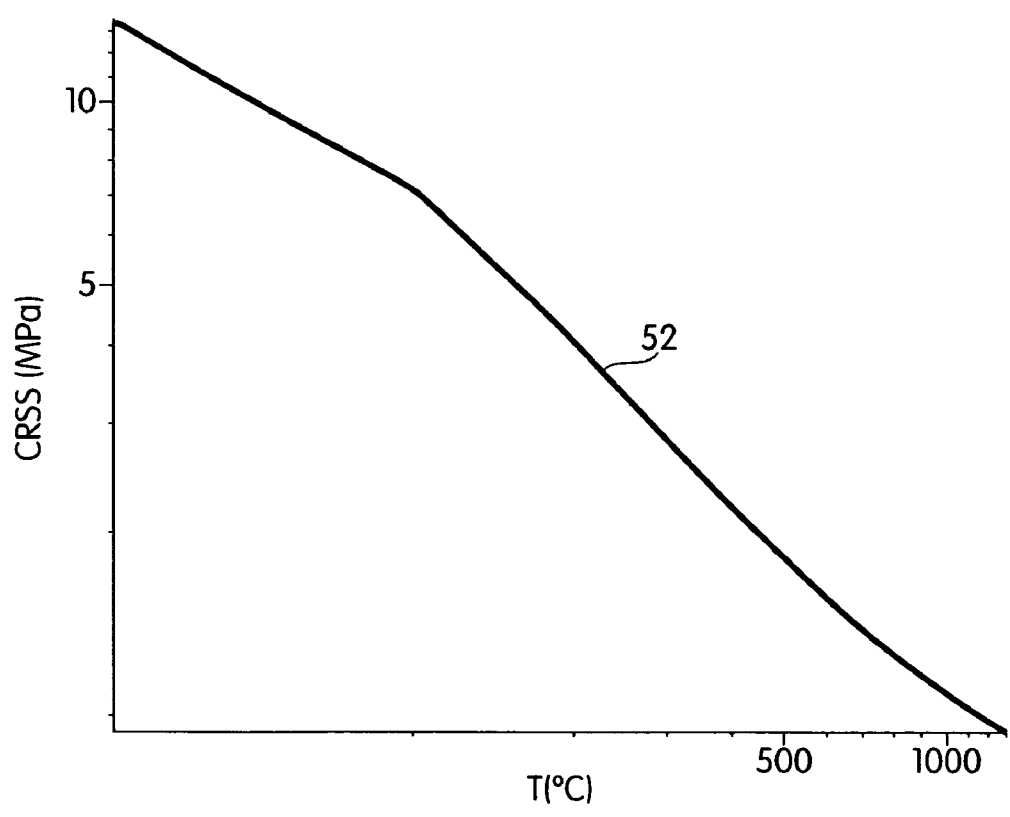
FIG. 2 is a graph of critical resolved shear stress vs. temperature.

It has been concluded that the temperature dependence of the CRSS for a single crystal of $CaF_2$ is given by:

$$CRSS = 0.5 e^{(990/T)} \quad (1),$$

where T is the temperature in units of Kelvin, and the CRSS has the units of MPa. Referring to FIG. 2, the CRSS 52 for $CaF_2$ according to Equation (1) is shown to decrease with increasing temperature, and vice versa. Although the CRSS of $CaF_2$ increases with decreasing temperature, it is fairly low even at temperatures close to room temperature. Thus, to help avoid plastic deformation, and hence birefringence, the temperature variations in the crystal are controlled by the system 10.

For cylindrical blanks 12, radial temperature gradients are the primary mechanism for generation of thermal stresses in the single crystal blank 12. Thus, stresses can be kept below the CRSS by controlling the edge-to-center radial temperature difference within the crystal, the radial temperature difference $\Delta T$. $\Delta T$ can be approximated according to:

$$\Delta T = \frac{CRSS}{\phi \lambda E}, \quad (2)$$

where $\phi$ is a configuration number related to the slip system of the crystal, $\lambda$ is the thermal expansion coefficient of the material, and E is the Young Modulus.

It has been calculated that for a cylindrical single crystal of $CaF_2$, regardless of the crystal's dimensions, radial temperature differences, $\Delta T$, exceeding:

approximately 0.5° C. at 1000° C. or higher,
approximately 0.7° C. at 800° C.,
approximately 1.2° C. at 500° C., and
approximately 3.5° C. at 200° C., will cause the CRSS to be exceeded. The values of $\Delta T$ vary approximately linearly between the values provided. Thus, $\Delta T$ varies approximately linearly from about 0.5° C. at an average blank temperature of 1000° C. to about 0.7° C. at an average blank temperature of 800° C., varies approximately linearly from about 0.7° C. at an average blank temperature of 800° C. to about 1.2° C. at an average blank temperature of 500° C., and varies approximately linearly from about 1.2° C. at an average blank temperature of 500° C. to about 3.5° C. at an average blank temperature of 200° C. To avoid plastic deformations inside a single crystal of $CaF_2$, even as large as 30 cm in diameter and 10 cm in height, the system 10 is configured to keep the values of $\Delta T$ in the crystal at relatively low values.

The temperature difference $\Delta T$ is proportional to the cooling rate for the blank 12. The proportionality depends on the blank's material properties, size, and shape, and can be determined, e.g., by computer models or analytical expressions (in simple cases). Using knowledge of this proportionality, Equation (1), and Equation (2), the cooling rate can be determined to inhibit, if not prevent, plastic deformation of the blank 12. The invention provides a schedule for controlled cool down of the annealed blank 12 such that the CRSS is not exceeded. A schedule for cool down helps ensure that during removal of heat from the crystal 12 during cool down, temperature variations in the crystal 12 are maintained at such low values that plastic deformation of the crystal 12 does not occur, or occurs within acceptable amounts.

Based on the properties of $CaF_2$ available publicly, a computational model has been used to calculate the rate of cooling so as not to have the center-to-edge temperature difference in a crystal induce stress above the CRSS. For example, if the annealed part is a single crystal of $CaF_2$ of diameter of 30 cm and height of 15 cm, and the entire surface of the crystal is maintained at substantially the same surface temperature, the surface temperature should obey the following cooling rates schedule:

approximately 0.5° C./hr from about 1000° C. to about 900° C.,
approximately 0.7° C./hr from about 900° C. to about 800° C.,
approximately 0.9° C./hr from about 800° C. to about 700° C.,
approximately 1.1° C./hr from about 700° C. to about 600° C.,
approximately 1.5° C./hr from about 600° C. to about 500° C.,
approximately 2.1° C./hr from about 500° C. to about 400° C.,
approximately 3.2° C./hr from about 400° C. to about 300° C., and
approximately 6.4° C./hr from about 300° C. and lower.

It has been concluded that the cooling rate CR for a cylindrically-shaped single crystal of $CaF_2$, with flat top and bottom, may be calculated from the formula:

$$CR = \frac{k \cdot \Delta T \cdot \text{thermal diffusitivity} \cdot [a0 + a1 \cdot (L/D) + a2 \cdot (L/D)^2]}{(L/D) \cdot \text{surface area}}. \quad (3)$$

The cooling rate is the cool-down rate in ° C./sec. Surface area is the surface area of the annealed part in units of $cm^2$. Thermal diffusivity is a property of the annealed part in units of $cm^2$/sec. L/D is the ratio of the height versus the diameter of the blank 12. The parameters a0, a1, and a2 are constants with exemplary values of a0, a1, and a2 are 1.349, −2.146, and 1.948, respectively, that may be used for different sizes of blanks, and that depend upon the k values provided below. The parameter k is a constant whose value is a function of the average temperature of the blank 12 and can be determined experimentally or from numerical simulations for different shapes of the blank 12 and various embodiments of the invention including, but not limited to, the system 10. The constant k may have the following values as a function of the average temperature of the blank 12:

approximately 95 from about 1000° C. to about 900° C.,
approximately 93 from about 900° C. to about 700° C.,
approximately 94 from about 700° C. to about 600° C.,
approximately 98 from about 600° C. to about 500° C.,
approximately 107 from about 500° C. to about 400° C.,
approximately 128 from about 400° C. to about 300° C., and
approximately 193 from about 300° C. and lower.

Figure 3:
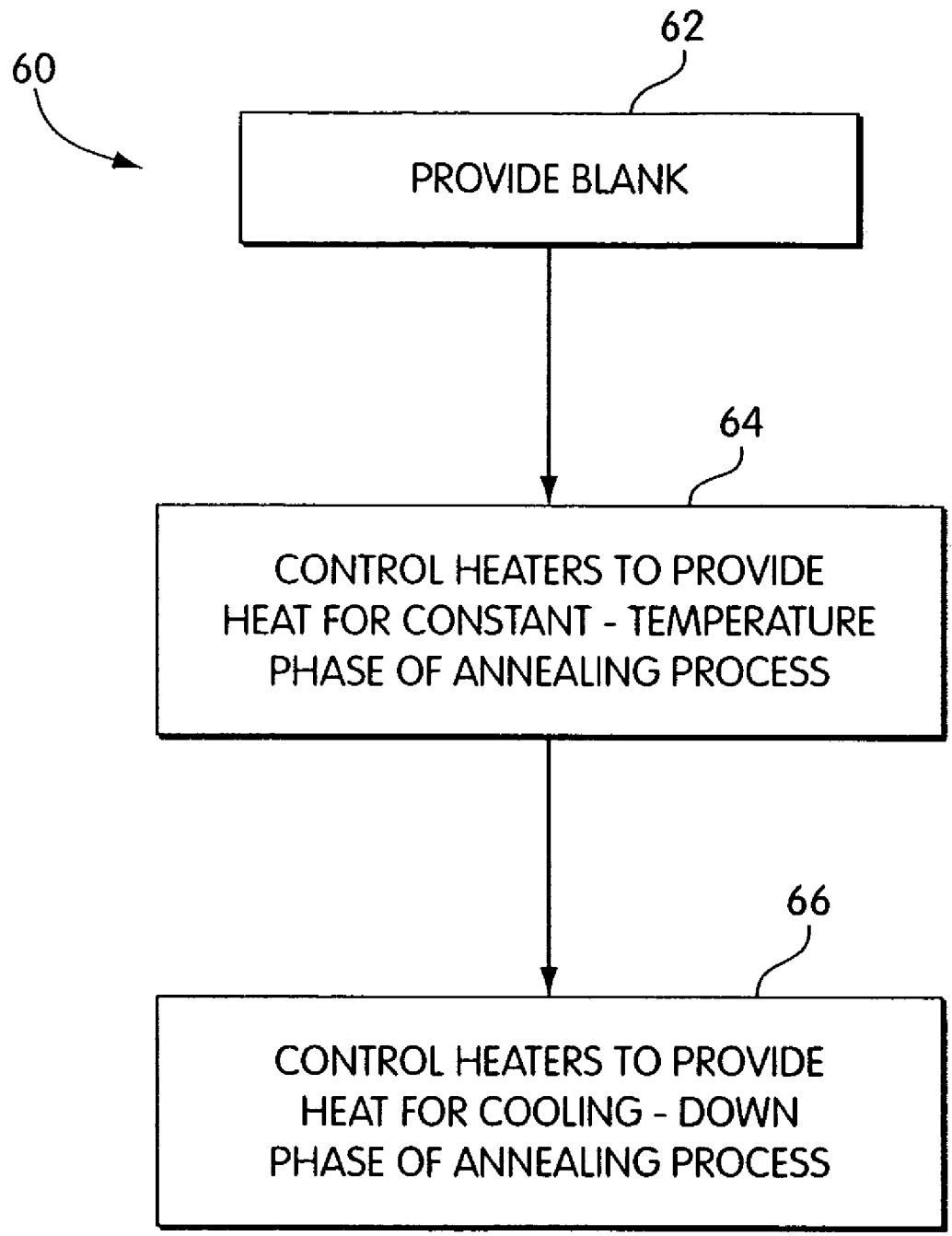
FIG. 3 is a block flow diagram of an annealing process using the system shown in FIG. 1.

Referring to FIG. 3, with further reference to FIGS. 1–2, a process 60 of annealing the blank 12 includes stages 62, 64, and 66. At stage 62 the blank 12 is provided. At this stage, the blank 12 is placed in the volume 48 defined by the inner housing 14.

At stage 64, the controllers 29, 31, 33 control the heaters 28, 30, 32 to provide heat. The heaters 28, 30, 32 provide heat to heat the blank 12 to a desired constant temperature for the constant-temperature phase of the annealing process. The temperature of the blank 12 is attempted to be kept at a constant and substantially uniform temperature by the controllers 29, 31, 33 receiving indicia of temperatures from the temperature sensors 40, 42, 44 and providing control signals to the heaters 28, 30, 32. The control signals control (including causing variances in, as appropriate) the power used by the heaters 28, 30, 32, and thus the heat produced by these heaters 28, 30, 32 as appropriate to maintain the temperature of the surface 50 of the inner housing 14 and thereby the temperature of the blank 12. The power of the heaters 28, 30, 32 is regulated such that the temperature sensors 40, 42, 44 measure substantially fixed set values. These values are held substantially constant for the time duration of the constant-temperature phase of the annealing process.

At stage 66, the controllers 29, 31, 33 regulate the heaters 28, 30, 32 to cool the blank 12 down. Again, responsive to temperatures indicated by the temperature sensors 40, 42, 44, the controllers 29, 31, 33 send control signals to the heaters 28, 30, 32 to adjust as necessary, the power used and thus the heat provided by the heaters 28, 30, 32. The controllers 29, 31, 33 regulate the heat provided such that the temperature as indicated by the sensors 40, 42, 44 follow a predetermined cooling rate schedule that has been determined to guard against temperature gradients within the blank 12 causing stresses to exceed the CRSS of the blank 12. In particular, the heat is regulated to guard against temperature gradients in the blank 12 (e.g., radial temperature gradients for a cylindrical blank 12) exceeding values that would cause resolved sheer stresses in the blank 12 to exceed the CRSS of the blank 12.

Using the method 60, the blank 12 can be produced having desired characteristics. For example, the $CaF_2$ blank 12 can be produced with residual stress birefringence that is less than approximately 1 nm/cm. This birefringence is then acceptable for very fine resolution photolithography applications.

Figure 4:
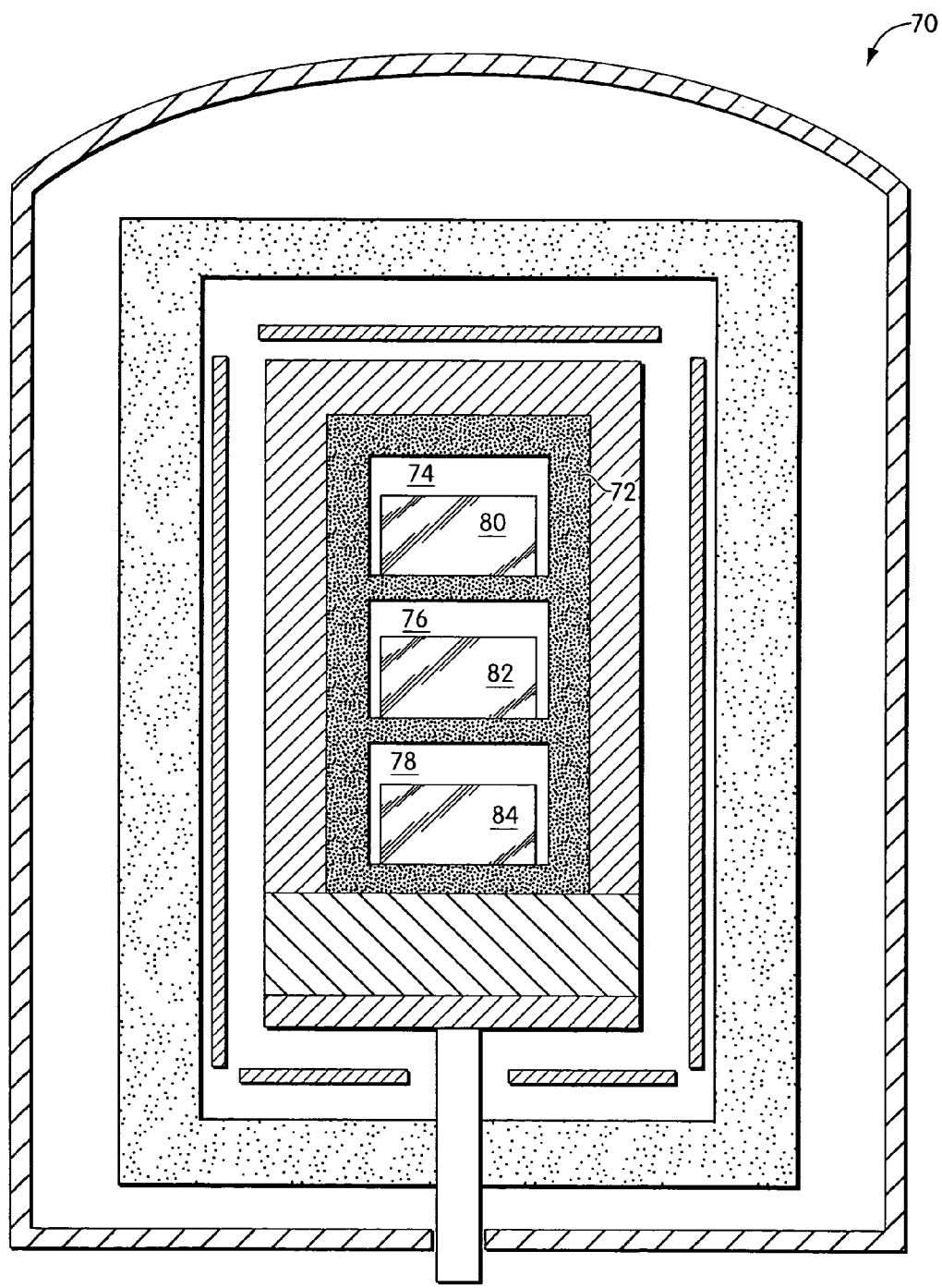
FIG. 4 is a cross-sectional view (with blanks shown in cut-away) of another annealing system, for annealing multiple blanks currently.

Referring to FIG. 4, a system 70 similar to the system 10 (FIG. 1) includes components that are different from, but similar to, that of system 10 to accommodate an inner housing 72 that is different from the inner housing 14 (FIG. 1). The inner housing 72 defines three volumes 74, 76, 78 that are sized to accommodate three respective blanks 80, 82, 84. Each of the blanks 80, 82, 84 may be the same or different sizes, e.g. cylindrical with a height of 10 cm and a diameter of 30 cm. Other components of the system 70 are similar to the respective components of system 10, but different in order to accommodate the multiple blanks 80, 82, 84 while providing similar functionality, e.g., substantially isothermal environments for the blanks 80, 82, 84. While three volumes 74, 76, 78 are shown in FIG. 4, other numbers of volumes may be provided.

Other embodiments are within the scope and spirit of the appended claims. For example, referring to FIG. 1, a support structure can be provided in the volume 48 defined by the inner housing 14 to separate the blank 12 from the walls of the housing 14. Also, the housings 14 and 16 may be integrally formed of layers having different thermal conductivities, with a higher thermal conductivity layer, or layers, being disposed inward of a lower thermal conductivity layer, or layers. The blank 12 may be of a variety of materials, such as semiconductors, or other materials, even if not for optical uses, for which annealing or other heating/cooling is desired and in which temperature gradients are undesirable. Also, items other than blank 12 can be annealed using the system 10, such as optical components, lenses, prisms, and single crystals, e.g., fluorides, other than $CaF_2$. Also, although each heater and temperature sensor combination is shown in FIG. 1 with its own controller, a controller may be used to regulate more than one, and even all, of the heaters responsive to temperature indicia from the temperature sensors. The base 20 can be made of layers or can be a composite of low and high thermal conductivity materials in order to provide a sufficiently sturdy and sufficiently low thermal conductivity member. One or more of the heaters can be enclosed in portions of the housing 16 or support 22 (e.g., in platform 24). Temperature indicia provided by the temperature sensors 40, 42, 44 can be of the inner surface 50 of the inner housing 14, or an interior portion of the inner housing 14.

What is claimed is:

1. A method of heating an optical member, the method comprising:
   providing the optical member;
   directing heat from a heat source toward the optical member; and
   distributing the heat about the optical member through a high-thermal-conductivity apparatus disposed between the heat source and the optical member such that a surface of the apparatus defining a volume for receiving the optical member will have a substantially uniform temperature.

2. The method of claim 1 wherein the heat is distributed such that temperatures of the surface of the apparatus defining the volume vary by no more than about 0.5 Kelvin.

3. The method of claim 1 further comprising measuring at least one indication of temperature of the apparatus defining the volume.

4. The method of claim 3 wherein the at least one indication includes a plurality of indicia of temperature of the apparatus, the indicia being related to at least one of an outer surface, an inner surface, and an interior of the apparatus.

5. The method of claim 3 further comprising adjusting how much heat is directed toward the optical member in accordance with the at least one indication.

6. The method of claim 5 wherein the adjusting is in accordance with a model of temperature variations within the optical member.

7. The method of claim 5 wherein how much heat is directed toward the optical member is adjusted to guard against stress within the optical member exceeding a critical resolved shear stress of the optical member during at least one of annealing of the optical member and cool down of the optical member.

8. The method of claim 1 wherein a plurality of optical members is provided, wherein heat is directed from a heat source toward each of the optical members, and wherein the heat is distributed about each of the optical members through the high-thermal-conductivity apparatus disposed between the heat source and the optical members such that surfaces of the apparatus defining volumes for receiving the optical members will each have a substantially uniform temperature.

9. A method of annealing at least one optical member, the method comprising:
   providing the at least one optical member; and
   annealing the at least one optical member by heating the at least one optical member to an annealing temperature in a substantially isothermal environment and cooling the at least one optical member at a rate and in the substantially isothermal environment such that spatial temperature non-uniformities in the optical member stay below a level that would induce plastic deformation of the at least one optical member.

10. The method of claim 9 wherein the optical member comprises calcium fluoride.

11. The method of claim 10 wherein the cooling is performed such that temperature gradients inside of the optical member are less than about $0.5e^{(990/T)}$ MPa where T is an average temperature in Kelvin of the optical member.

12. The method of claim 11 wherein the optical member is cylindrical and the annealing is performed such that an edge-to-center temperature difference is less than a critical temperature difference (CTD), the CTD varying with average optical member temperature $T_{avg}$, the CTD:
  being about 0.5° C. for $T_{avg}$ above about 1000° C.;
  varying approximately linearly from about 0.5° C. at a $T_{avg}$ of 1000° C. to about 0.7° C. at a $T_{avg}$ of 800° C.;
  varying approximately linearly from about 0.7° C. at a $T_{avg}$ of 800° C. to about 1.2° C. at a $T_{avg}$ of 500° C.; and
  varying approximately linearly from about 1.2° C. at a $T_{avg}$ of 500° C. to about 3.5° C. at a $T_{avg}$ of 200° C.

13. The method of claim 12 wherein the cooling is performed at a cooling rate equal to:

$$\frac{k \cdot \Delta T \cdot \text{thermal diffusitivity} \cdot [a0 + a1 \cdot (L/D) + a2 \cdot (L/D)^2]}{(L/D) \cdot \text{surface area}}$$

where k, a0, a1, and a2 are constants, $\Delta T$ is the edge-to-center temperature difference, and L/D is a ratio of a height versus a diameter of the optical member.

14. The method of claim 13 wherein a0 is about 1.349, a1 is about −2.146, and a2 is about 1.948.

15. The method of claim 14 wherein the constant k is approximately:
  95 with $T_{avg}$ from about 10001° C. to about 900° C.,
  93 with $T_{avg}$ from about 900° C. to about 700° C.,
  94 with $T_{avg}$ from about 700° C. to about 600° C.,
  98 with $T_{avg}$ from about 600° C. to about 500° C.,
  107 with $T_{avg}$ from about 500° C. to about 400° C.,
  128 with $T_{avg}$ from about 400° C. to about 300° C., and
  193 with $T_{avg}$ from about 300° C. and lower.

16. The method of claim 9 wherein the annealing includes monitoring at least one indication of temperature and providing heat to the optical member dependent upon the at least one indication.

17. A relaxed-stress optical member made by a method comprising:
  providing a stressed optical member; and
  annealing the stressed optical member by heating the stressed optical member to an annealing temperature in a substantially isothermal environment to form an annealed optical member and cooling the annealed optical member at a rate and in the substantially isothermal environment such that spatial temperature non-uniformities in the annealed optical member stay below a level that would induce plastic deformation of the annealed optical member.

* * * * *